United States Patent
Pal

(10) Patent No.: US 8,310,831 B2
(45) Date of Patent: Nov. 13, 2012

(54) THERMAL PACKAGING OF A MOTOR CONTROLLER FOR AN AUXILIARY POWER UNIT

(75) Inventor: Debabrata Pal, Hoffman Estates, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 121 days.

(21) Appl. No.: 12/782,842

(22) Filed: May 19, 2010

(65) Prior Publication Data
US 2011/0286184 A1 Nov. 24, 2011

(51) Int. Cl.
*H05K 7/20* (2006.01)
(52) U.S. Cl. .................. 361/700; 361/704; 361/707
(58) Field of Classification Search .................. None
See application file for complete search history.

(56) References Cited

U.S. PATENT DOCUMENTS

| | | | |
|---|---|---|---|
| 4,879,630 A * | 11/1989 | Boucard et al. | 361/722 |
| 5,305,186 A * | 4/1994 | Appelt et al. | 361/704 |
| 5,508,908 A | 4/1996 | Kazama et al. | |
| 5,973,923 A * | 10/1999 | Jitaru | 361/704 |
| 6,147,869 A * | 11/2000 | Furnival | 361/719 |
| 6,160,696 A | 12/2000 | Bailey et al. | |
| 6,212,074 B1 | 4/2001 | Gonsalves et al. | |
| 6,529,394 B1 | 3/2003 | Joseph et al. | |
| 6,549,409 B1 * | 4/2003 | Saxelby et al. | 361/704 |
| 6,678,182 B2 | 1/2004 | Joseph et al. | |
| 6,777,822 B1 | 8/2004 | Suttie et al. | |
| 6,836,086 B1 | 12/2004 | Goldberg et al. | |
| 6,873,528 B2 | 3/2005 | Hulan et al. | |
| 7,193,850 B2 | 3/2007 | Pal | |
| 7,573,362 B2 | 8/2009 | Thiel et al. | |
| 2007/0018516 A1 | 1/2007 | Pal et al. | |

* cited by examiner

*Primary Examiner* — Boris Chervinsky
(74) *Attorney, Agent, or Firm* — Carlson, Gaskey & Olds, P.C.

(57) ABSTRACT

A starter motor controller for an auxiliary power unit transfers thermal energy from low thermal capacity electric components to high thermal capacity electric components to control temperature without active cooling systems.

14 Claims, 5 Drawing Sheets

THERMAL PACKAGING OF A MOTOR CONTROLLER FOR AN AUXILIARY POWER UNIT

BACKGROUND

This disclosure generally relates to motor starter controller for an auxiliary power unit (APU). More particularly, this disclosure relates to a motor starter controller including features for controlling thermal energy generated by electronic circuit components.

An APU can be started utilizing an electric motor. The electric motor is controlled by a motor controller unit including the required circuitry and electric components. The circuitry and electrical components generate heat that must be controlled to maintain the controller within desired operational limits. Some motor controllers separate heat producing circuits into separate units to spread thermal energy. Other motor controllers utilize an active cooling system that circulates coolant to remove heat and maintain the controller within desired operational limits. Each alternative adds additional parts and increases complexity and cost.

SUMMARY

A disclosed example starter motor controller for an auxiliary power unit transfers thermal energy from low thermal capacity electric components to high thermal capacity electric components to control temperature without active cooling systems. The example starter motor controller includes heat producing components mounted to both sides of a thermally conductive base plate. Thermal energy is absorbed by components with excess thermal capacity such that components with low thermal capacity remain within a desired operational temperature range without active cooling systems.

These and other features disclosed herein can be best understood from the following specification and drawings, the following of which is a brief description.

DETAILED DESCRIPTION

Figure 1:
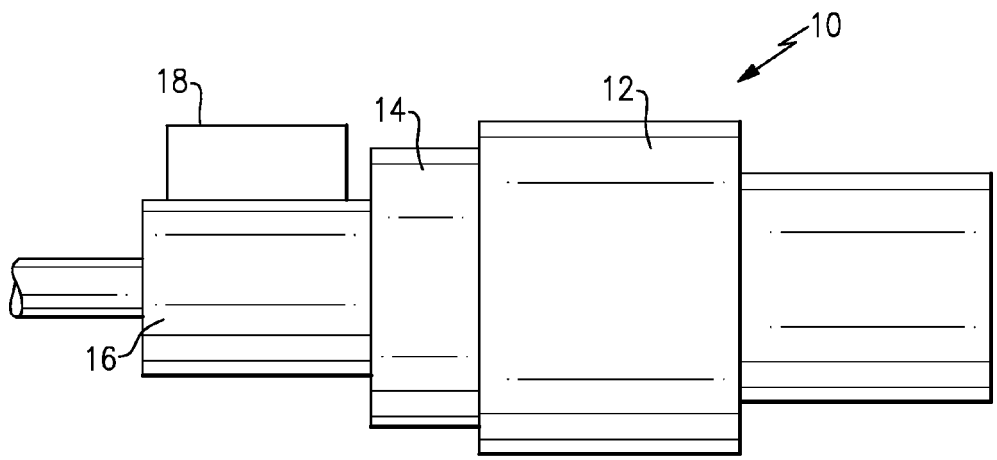
FIG. 1 is a schematic view of an example auxiliary power unit including a starter motor controller.

Referring to FIG. 1, an auxiliary power unit (APU) is schematically shown and indicated at 10 and includes a power generating device such as a gas turbine engine 12 that is driven for starting purposes by an electric motor 16 through a gearbox 14. As appreciated, the APU 10 can include other power generating devices and be configured differently than shown. The example electric motor 16 is controlled by a motor controller 18 (also referred to a motor starter controller 18 or controller 18). The motor controller 18 includes the electronic components necessary to condition the electrical power utilized to drive the electric motor 16. The example motor controller 18 is illustrated as a separate controller mounted to the electric motor 16. However, the motor controller 18 could be mounted in another location and may also be part of a larger control module that governs operation of all of the APU 10.

Electrical components that are part of the motor controller 18 operate within a desired temperature range. Operation of the motor controller 18, and thereby the electrical components making up the controller 18 generates thermal energy that must be dissipated to maintain the motor controller 18 within the desired temperature range.

Figure 2:
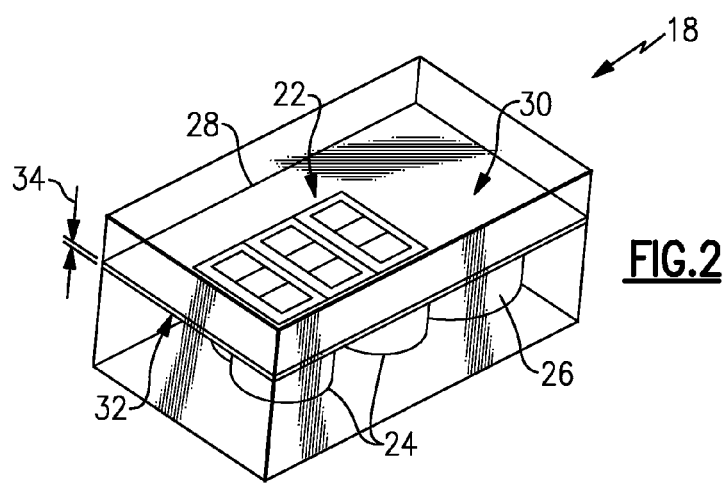
FIG. 2 is an perspective view of an example motor controller.
Figure 3:
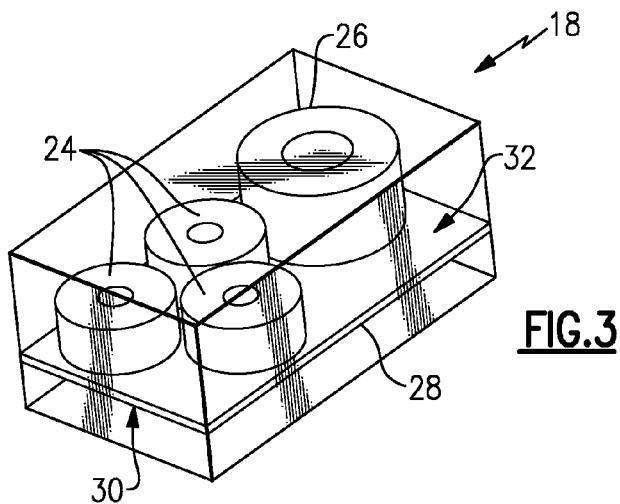
FIG. 3 is another perspective view of the example motor controller.

Referring to FIGS. 2 and 3, the example motor controller 18 is shown with only some of the electrical components required for operation. It should be understood that the motor controller 18 will include additional circuitry and electrical components beyond what is shown in this example. Accordingly, the view of the example motor controller 18 is simplified to provide clarity in this disclosure, and is no way intended to limit the scope of this disclosure.

The example motor controller 18 includes a base plate 28 that supports a heat producing electrical component on a first side 30. The example heat producing electrical component includes a group of three insulated gate bipolar transistors (IGBT) 22 that are mounted to the first side of the base plate 28. A second electrical component is mounted to a second side 32 of the base plate 28. In this example, the second electrical component includes inductors 24, 26. The inductors indicated at 24 are differential mode inductors and the inductor indicated at 26 is a common mode inductor. As appreciated, other inductor configurations and types as are known are within the contemplation and scope of this disclosure. The inductors 24, 26 include a mass that is much greater than that of the IGBTs 22. The mass of the inductors 24, 26 provides a capacity for absorbing thermal energy. Accordingly, the greater mass of the inductors 24, 26 requires more heat energy to cause an increase in temperature. The capacity for the mass to absorb heat energy or thermal mass of the inductors 24, 26 is utilized to absorb heat generated during operation by the IGBTs 22 and thereby substantially reduce or eliminate the need for an active cooling system.

The inductors 24, 26 are mounted on the base plate 28 at substantially the same location as the IGBTs 22 are mounted on the opposite side of the base plate 28. In other words, the inductors 24, 26 are located in alignment with the IGBTs 22 such that heat energy can be efficiently transferred through the base plate 28. The alignment of the inductors 24, 26 is arranged to provide a desired placement of the thermal mass of the inductors 24, 26 relative to the IGBTs 22 to provide the desired thermal conduction through the base plate 28 between the IGBTs 22 and the inductors 24, 26.

Figure 4:
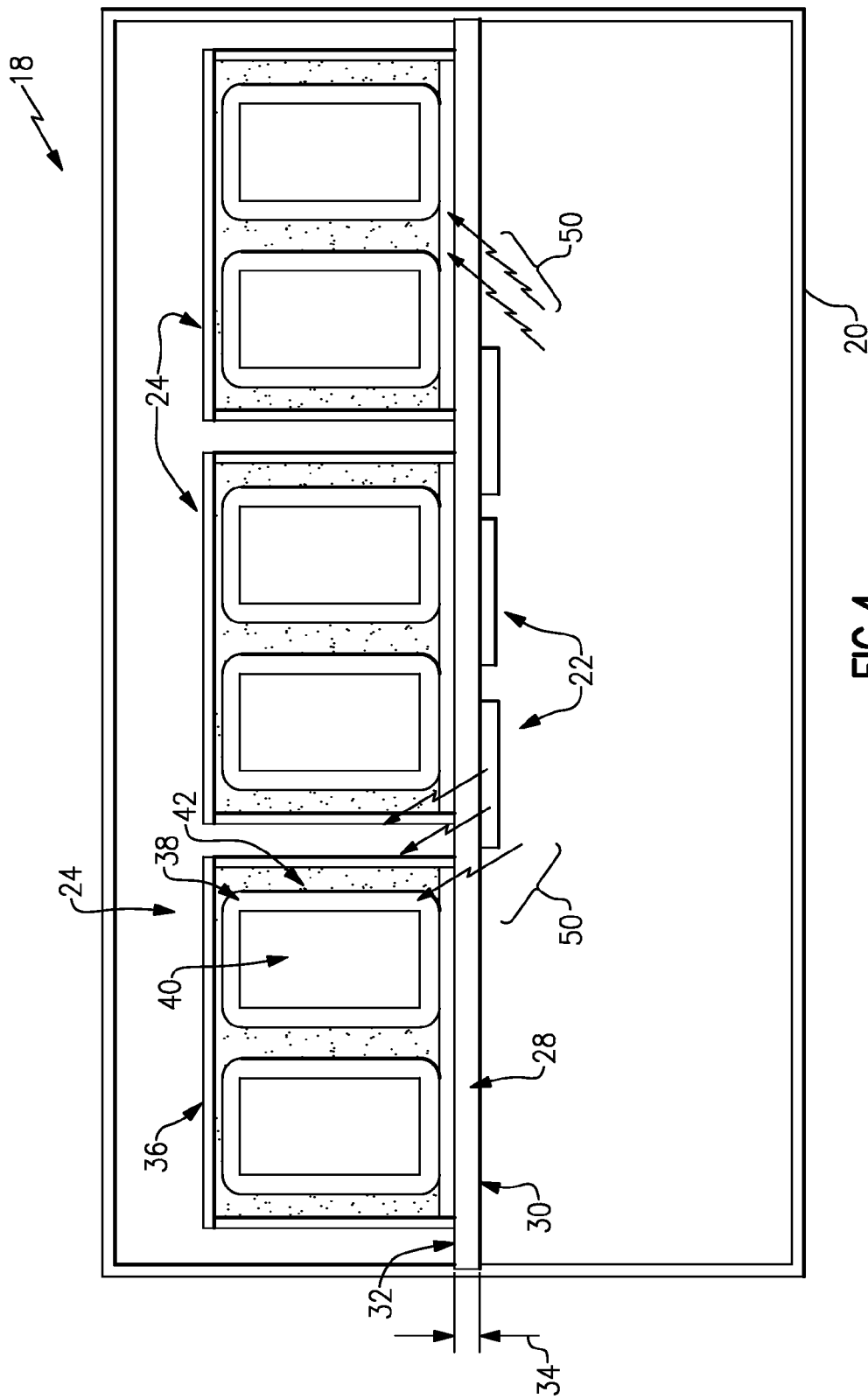
FIG. 4 is a schematic cross-section of the example motor controller.

Referring to FIG. 4, the example controller 18 is shown schematically and includes the base plate 28 within an enclosure 20. The example enclosure supports the base plate 28 and provides a protected environment for the electronic components that make up the feature of the controller 18. The base plate 28 is formed from a thermally conductive material. The base plate 28 may also be formed of an electrically conductive material or a non-electrically conductive material. The example base plate 28 is formed from aluminum, but other materials or composites that provide thermal conduction could also be utilized. Moreover, the shape of the example base plate 28 is rectangular, but could be formed in any shape desired to support the required circuitry and electrical components. The example base plate 28 is of a thickness 34 that is determined to provide the desired thermal conduction between the first and second sides 30, 32.

The example heat producing IGBTs 22 are mounted as known to the first side 30 of the base plate 28. The inductors 24 (only the differential mode inductors 24 are shown in FIG. 4) are mounted to the second side 32 as known. The inductors 24 include a core 40 about which is wrapped winding 38. The core 40 and winding 38 are mounted within a housing 36. The example housing 36 is formed from aluminum and is seated on the base plate 28. The housing 36 could also be formed from other thermally conductive materials as are known. As depicted in FIG. 4, each of the inductors 24 may have a separate housing 36. The housing 36 is filled with a potting material 42 that surrounds most of the core 40 and winding 38. The potting material 42 is formed of a thermally conductive and electrically non-conductive material.

The core 40 is a ferromagnetic material such as iron and the windings 38 include a desired number of coils of coated copper wire. Other core and winding materials as are known could also be utilized within the scope of this disclosure. The mass of the combined core 40 and windings 38 provide the thermal mass that absorbs heat 50 that is generated by the IGBTs 22. The housing 36, potting material 42 and base plate 28 provide a thermally conductive path between the IGBTs 22 and the inductors 24.

Figure 5:
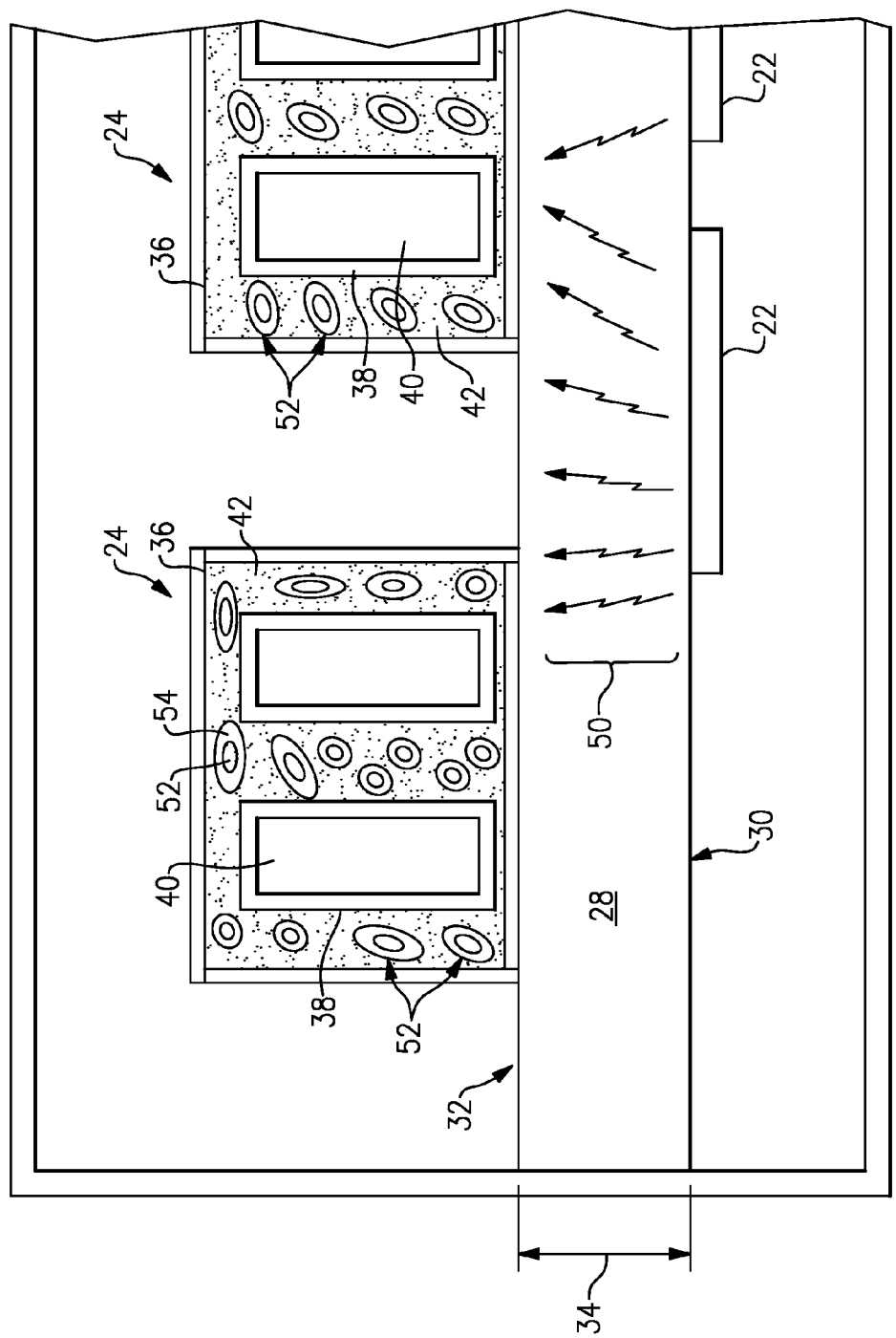
FIG. 5 is another schematic cross-section of an example motor controller.

Referring to FIG. 5, in another example, the potting compound 42 is mixed with solid-liquid phase change materials 52. The phase change materials 52 are in solid form up to a melting point that is within a temperature range of operation of the example controller 18. Melting of the solid-liquid phase change materials 52 increase the capacity of the inductors 24 to absorb heat, commonly referred to as thermal capacity. The example solid-liquid phase change materials 52 can be of a material such as for example n-Tetracontane or Pentacontane. Both materials have melting points below the temperature range of operation for the example control 18. In this example, the desired operation range is below 125° C. (257° F.). The Tetracontane material melts at approximately 82° C. (179° F.) and the Pentacontane material melts at approximately 95° C. (203° F.). Melting of the materials increase the amount of thermal energy that can be absorbed before temperatures begin to rise. Once the temperature drops back below the materials melting points, the solid-liquid phase change materials 52 change back to a solid.

In this example, the solid-liquid phase change materials 52 are microencapsulated within a phase change material 54 to maintain the solid-liquid phase change material separate from the potting material. In this example, the micro-encapsulant is sytcast-5954; however other known materials that provide the desired thermal conductivity could be utilized. Moreover, the phase change material 52 could be pored into a matrix of high thermal conductivity material such as for example Aluminum nitride or Boron Nitride particles. As appreciated, other example high thermal conductive materials are also within the contemplation of this disclosure.

Figure 6:
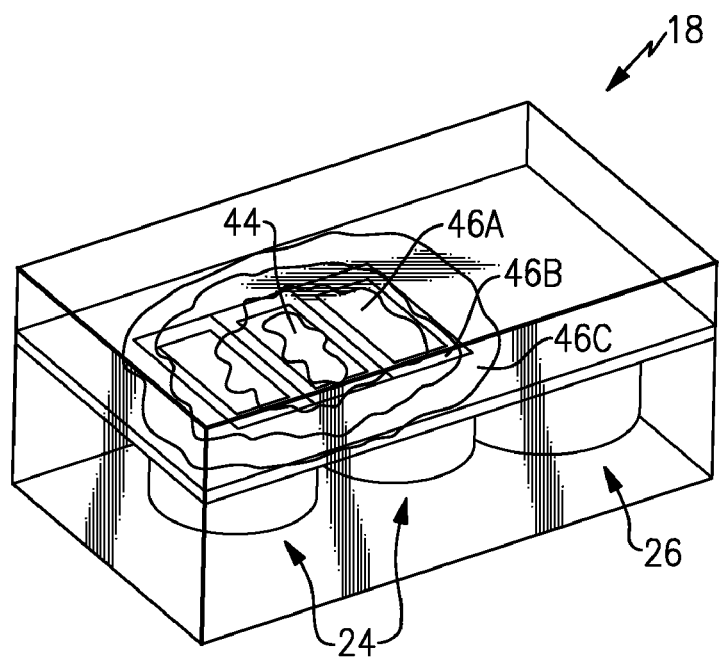
FIG. 6 is a perspective view of an example thermal analysis of the example motor controller.

Referring to FIGS. 5 and 6, during operation the electric components generate heat by various mechanisms. The IGBTs 22 produce heat by switching losses and conduction losses. The inductors 24, 26 produce heat in the form of joule heating loss, eddy loss and induction loss. Both the IGBTs 22 and the inductors 24, 26 generate heat. Because the inductors 24, 26 have a large thermal mass, they do not heat up quickly and remain with desired operational ranges. However, the IGBTs 22 have a very low thermal mass and therefore heat up quickly. In this example the desired temperature range is less then 125° C. (257° F.). The limited mass provided by the IGBTs 22 results in the generation of a great deal of thermal energy as compared to the thermal mass, which in turn causes a corresponding rise in temperature. However, this controller 18 conducts this thermal energy from the IGBTs 22 into the inductors 24, 26. Therefore, the excess thermal capacity present in the inductors 24, 26 is utilized to manage the thermal energy generated by the IGBTs 22.

Figure 7:
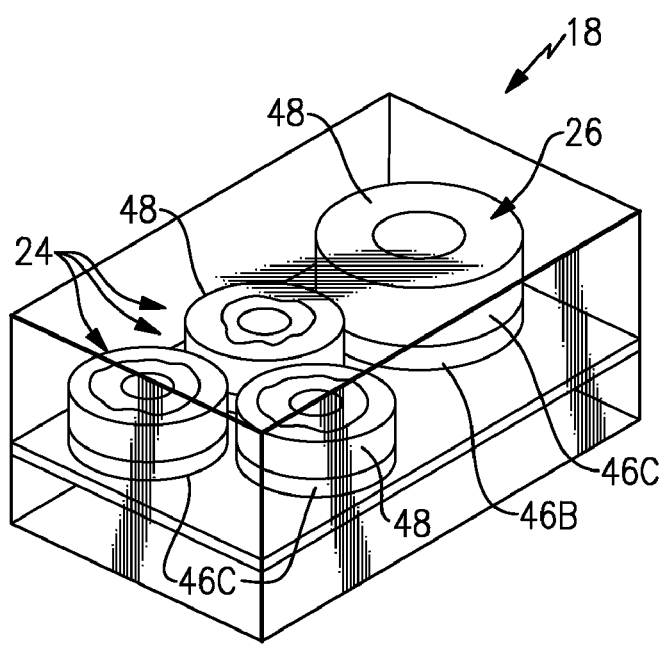
FIG. 7 is another perspective view of the example thermal analysis of the example motor controller.

FIGS. 6 and 7 are representations of the amount and spread of thermal energy between the IGBTs 22 and the inductors 24, 26. A high heat zone 44 is centered on the IGBTs 22 (FIG. 6) and radiates outward with successive mid range heat zones 46A, 46B and 46C. The inductors 24, 26 in thermally conductive contact with the IGBTs 22 absorb this heat energy, but still remain substantially in a low heat condition indicated by shading 48 (FIG. 7). Accordingly, even with the high amount of heat given off by the IGBTs 22, the inductors 24, 26, with the high thermal mass and capacity remain within a substantially cooler condition indicated by the heat zone 48.

Figure 8:
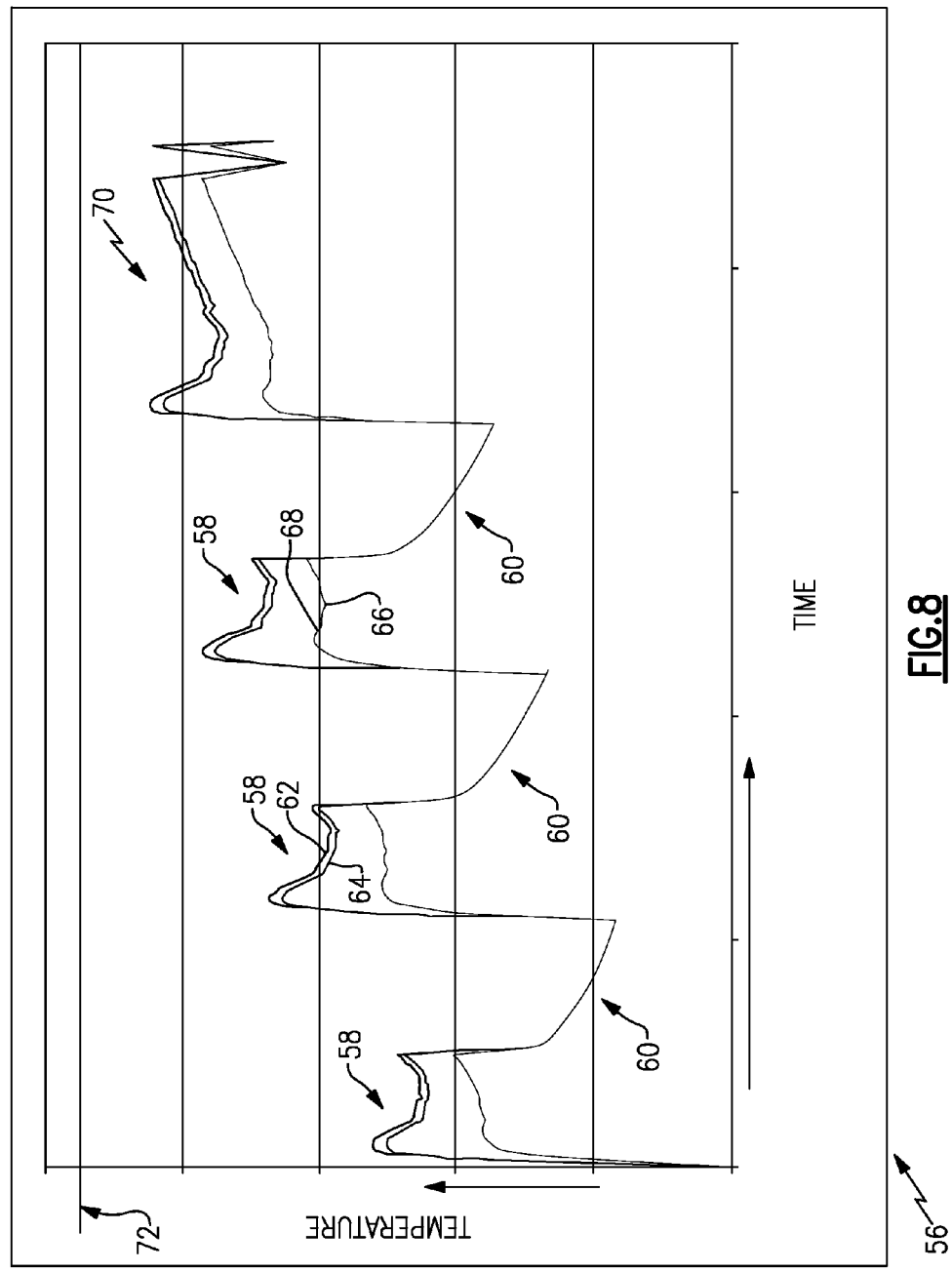
FIG. 8 is a graph shown temperature performance of an example motor controller.

Referring to FIG. 8, a graph indicated at 56, illustrates that even in the most extreme conditions, the temperature of the controller 18 remains within acceptable operational limits. In this example of an attempted start of the APU 10 (FIG. 1) for three consecutive times 58 with starting occurring on a fourth attempt 70. Each start attempt 58 is followed by interim period 60 before the next start attempt 58. The interim period 60 is not long enough to provide for complete cooling back to ambient conditions, and therefore heat produced by the components builds upon itself. In this example, the temperature of a first IGBT is indicated at 62 and of a second IGBT is indicated at 64 are shown and progressively increase in temperature with each start attempt. Corresponding temperatures are taken of two other components indicated at 66 and 68. In this example, the additional components are diodes. Even with the build up of heat, the greatest temperature remains below a desired threshold temperature 72 during all points of operation. As appreciated, other configurations and other operational temperature ranges are within the contemplation and scope of this disclosure.

As appreciated, electrical energy transferred through the controller 18 is dissipated by the electrical components contained with the controller 18 without external or active cooling systems. The produced thermal energy is transferred from the electrical components with a low thermal capacity, in this example, the IGBTs 22 to the electrical components with a high thermal capacity, in this example, the inductors 24, 26. This transfer of thermal energy through the conductive base plate 28 provides the desired thermal management required to maintain the controller 18 within desired operational limits.

Although an example embodiment has been disclosed, a worker of ordinary skill in this art would recognize that certain modifications would come within the scope of this disclosure. For that reason, the following claims should be studied to determine the scope and content of this invention.

What is claimed is:

1. A motor starter controller for an auxiliary power unit (APU), the motor starter controller comprising:
a base plate including a first side and a second side formed of a thermally conductive material;
a heat producing electrical component mounted to the first side of the base plate, the heat producing electrical component having a first mass; and
at least one inductor including a second mass greater than the first mass, the at least one inductor mounted to the second side of the base plate opposite the heat producing electrical component, the at least one inductor absorbing a portion of heat produced by the heat producing electrical component mounted on the first side of the base plate, wherein the at least one inductor comprises a winding within a housing, with an encapsulating material partially surrounding the winding within the housing, the encapsulating material comprising a thermally conductive and electrically non-conductive material.

2. The motor starter controller as recited in claim 1, wherein the heat producing electrical component comprises at least one insulated gate bipolar transistor (IGBT).

3. The motor starter controller as recited in claim 1, wherein the encapsulating material comprises a solid-liquid phase change material such that a portion of the encapsulating material changes from a solid to a liquid responsive to absorbing heat.

4. The motor starter controller as recited in claim 3, wherein the solid-liquid phase change material is microencapsulated to maintain separation of the solid-liquid phase change material and the encapsulating material in both a solid and liquid phase.

5. The motor starter controller as recited in claim 1, wherein the second electrical component is mounted to the second side of the base plate in substantially the same position as the heat producing electrical component is mounted to the first side of the base plate.

6. An auxiliary power unit comprising:
a gas turbine engine;
an electric motor for starting the gas turbine engine; and
a motor starter controller module for controlling operation of the electric motor, the motor controller including a base plate formed of a thermally conductive material, a heat producing electric component mounted to a first side of the base plate and at least one inductor mounted to a second side opposite the heat producing component, the least one inductor absorbs heat produced by the heat generating electrical component through the base plate, wherein the at least one inductor comprises a winding within a housing, with an encapsulating material partially surrounding the winding within the housing, the encapsulating material comprising a thermally conductive and electrically non-conductive material.

7. The auxiliary power unit as recited in claim 6, wherein the second electrical component comprise a mass greater than the first electrical component.

8. The auxiliary power unit as recited in claim 6, wherein the heat producing electrical component comprises at least one insulated gate bipolar transistor (IGBT).

9. The auxiliary power unit as recited in claim 6, wherein the encapsulating material comprises a solid-liquid phase change material such that a portion of the encapsulating material changes from a solid to a liquid responsive to absorbing heat.

10. The auxiliary power unit as recited in claim 9, wherein the solid-liquid phase change material is microencapsulated to maintain separation of the solid-liquid phase change material and the encapsulating material in both a solid and liquid phase.

11. The auxiliary power unit as recited in claim 6, wherein the second electrical component is mounted to the second side of the base plate in substantially the same position as the heat producing electrical component is mounted to the first side of the base plate.

12. A method of controlling thermal energy produced during operation of a motor controller comprising the steps of:
mounting a heat producing electrical device on a first side of thermally conductive support;
mounting at least one inductor proximate the heat producing electrical device on the thermally conductive support, wherein the inductor includes a winding disposed within a housing and an encapsulating material disposed about the winding, the encapsulating material including a solid-liquid phase change material and the absorbing of heat comprises absorbing heat with the solid-liquid phase change material; and
absorbing a substantial portion of heat generated by the heat producing electrical device with the at least one inductor.

13. The method as recited in claim 12, wherein the first electrical device comprises an integrated gate bipolar transistor (IGBT) module.

14. The method as recited in claim 12, wherein the at least one inductor is mounted to a second side opposite the first side of the thermally conductive support.

* * * * *